United States Patent
Akiba et al.

(10) Patent No.: US 9,783,723 B2
(45) Date of Patent: Oct. 10, 2017

(54) THERMAL CONDUCTIVE SILICONE COMPOSITION AND SEMICONDUCTOR DEVICE

(71) Applicant: Shin-Etsu Chemical Co., Ltd., Tokyo (JP)

(72) Inventors: Shota Akiba, Annaka (JP); Kenichi Tsuji, Annaka (JP); Kunihiro Yamada, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/281,490

(22) Filed: Sep. 30, 2016

(65) Prior Publication Data

US 2017/0096591 A1 Apr. 6, 2017

(30) Foreign Application Priority Data

Oct. 2, 2015 (JP) .................. 2015-196862

(51) Int. Cl.
*H01L 23/34* (2006.01)
*C09K 5/14* (2006.01)
(Continued)

(52) U.S. Cl.
CPC ............. *C09K 5/14* (2013.01); *C08L 83/04* (2013.01); *H01L 23/3675* (2013.01);
(Continued)

(58) Field of Classification Search
CPC ............. H01L 23/3675; H01L 23/3737; H01L 2224/32245; H01L 2224/29291;
(Continued)

(56) References Cited

U.S. PATENT DOCUMENTS 6,017,587 A 1/2000 Kleyer et al.
6,797,772 B2 9/2004 Nakayoshi et al.
(Continued)

FOREIGN PATENT DOCUMENTS

EP 0 382 188 A1 8/1990
EP 0 823 451 A1 2/1998
(Continued)

OTHER PUBLICATIONS

Extended European Search Report dated Jan. 27, 2017, in European Patent Application No. 16190314.1.

*Primary Examiner* — (Vikki) Hoa B Trinh
(74) *Attorney, Agent, or Firm* — Birch, Stewart, Kolasch & Birch, LLP

(57) ABSTRACT

Provided is a thermal conductive silicone composition having a superior thermal conductivity. The thermal conductive silicone composition contains:
(A) an organopolysiloxane that exhibits a kinetic viscosity of 10 to 100,000 mm$^2$/s at 25° C., and is represented by the following average composition formula (1)

$$R^1_a SiO_{(4-a)/2} \qquad (1)$$

wherein $R^1$ represents a hydrogen atom or at least one group selected from a hydroxy group and a saturated or unsaturated monovalent hydrocarbon group having 1 to 18 carbon atoms, and a satisfies $1.8 \leq a \leq 2.2$; and
(B) a silver powder having a tap density of not lower than 3.0 g/cm$^3$ and a specific surface area of not larger than 2.0 m$^2$/g, such silver powder being in an amount of 300 to 11,000 parts by mass with respect to 100 parts by mass of the component (A).

13 Claims, 1 Drawing Sheet

(51) Int. Cl.
*H01L 23/367* (2006.01)
*H01L 23/373* (2006.01)
*H01L 23/00* (2006.01)
*C08L 83/04* (2006.01)
*C08K 3/08* (2006.01)

(52) U.S. Cl.
CPC .......... *H01L 23/3737* (2013.01); *H01L 24/32* (2013.01); *H01L 24/83* (2013.01); *C08K 2003/0806* (2013.01); *C08K 2201/001* (2013.01); *C08L 2666/54* (2013.01); *H01L 2224/16225* (2013.01); *H01L 2224/29291* (2013.01); *H01L 2224/29339* (2013.01); *H01L 2224/32225* (2013.01); *H01L 2224/32245* (2013.01); *H01L 2224/33181* (2013.01); *H01L 2224/73204* (2013.01); *H01L 2224/73253* (2013.01); *H01L 2224/83203* (2013.01); *H01L 2924/0715* (2013.01); *H01L 2924/1432* (2013.01)

(58) Field of Classification Search
CPC . H01L 2224/73253; H01L 2224/29339; H01L 2224/16225; H01L 2224/32225; H01L 2224/33181; H01L 2224/73204; H01L 2224/83203; H01L 24/32; H01L 24/83; C09K 5/14
See application file for complete search history.

(56) References Cited

U.S. PATENT DOCUMENTS

| | | | |
|---|---|---|---|
| 7,538,075 B2 * | 5/2009 | Yamada | C08K 3/08 508/208 |
| 2002/0018885 A1 | 2/2002 | Takahashi et al. | |
| 2007/0293624 A1 | 12/2007 | Matsumoto et al. | |
| 2013/0105726 A1 | 5/2013 | Tsuji et al. | |

FOREIGN PATENT DOCUMENTS

| | | |
|---|---|---|
| EP | 0 982 391 A1 | 3/2000 |
| JP | 2-153995 A | 6/1990 |
| JP | 3-014873 A | 1/1991 |
| JP | 10-110179 A | 4/1998 |
| JP | 2000-063872 A | 2/2000 |
| JP | 2000-063873 A | 2/2000 |
| JP | 3130193 B2 | 1/2001 |
| JP | 2002-030217 A | 1/2002 |
| JP | 3677671 B2 | 8/2005 |
| JP | 2008-222776 A | 9/2008 |

* cited by examiner

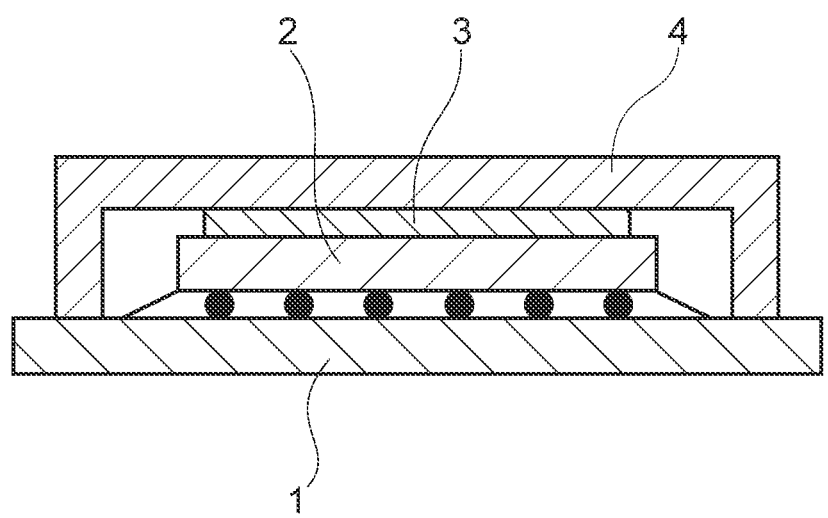

THERMAL CONDUCTIVE SILICONE COMPOSITION AND SEMICONDUCTOR DEVICE

BACKGROUND OF THE INVENTION

Field of the Invention

The present invention relates to a silicone composition superior in thermal conductivity; and a semiconductor device.

Background Art

Most electronic parts generate heat while in use. Thus, it is required that heat be removed from these electronic parts for the purpose of appropriately operating the same. Particularly, with regard to an integrated circuit element such as a CPU used in a personal computer, the amount of heat generated therefrom has increased due to an increased operation frequency thereof, thus making a countermeasure(s) against heat a critical issue.

Therefore, there have been proposed many methods for releasing such heat. In the case of an electronic part generating a particularly large amount of heat, there has been proposed a method for releasing the heat by interposing a thermal conductive material such as a thermal conductive grease or a thermal conducive sheet between the electronic part and a member such as a heatsink.

JP-A-Hei-2-153995 discloses a silicone grease composition obtained by combining a particular organopolysiloxane and a spherical hexagonal aluminum nitride powder with a given particle diameter. JP-A-Hei-3-14873 discloses a thermal conductive organosiloxane composition obtained by combining an aluminum nitride powder with a smaller particle diameter and an aluminum nitride powder with a larger particle diameter. JP-A-Hei-10-110179 discloses a thermal conductive silicone grease obtained by combining an aluminum nitride powder and a zinc oxide powder. JP-A-2000-63872 discloses a thermal conductive grease composition employing an aluminum nitride powder surface-treated by an organosilane.

The thermal conductivity of an aluminum nitride is 70 to 270 W/mK. As a material having a thermal conductivity higher than this range, there can be listed diamond which has a thermal conductivity of 900 to 2,000 W/mK. JP-A-2002-30217 discloses a thermal conductive silicone composition obtained by combining a silicone resin with a diamond, a zinc oxide and a dispersant.

Further, JP-A-2000-63873 and JP-A-2008-222776 disclose a thermal conductive grease composition obtained by mixing a base oil such as a silicone oil and a metallic aluminum powder.

Furthermore, there have also been disclosed, for example, JP-B No. 3130193 and JP-B No. 3677671, where a silver powder with a high thermal conductivity is used as a filler.

However, none of these thermal conductive materials or thermal conductive greases has been able to sufficiently cope with the amount of heat generated in a recent integrated circuit element such as a CPU.

SUMMARY OF THE INVENTION

Therefore, it is an object of the present invention to provide a thermal conductive silicone composition capable of exhibiting a favorable heat dissipation effect.

The inventors of the present invention diligently conducted a series of studies to achieve the above objective, and completed the invention as follows. That is, the inventors found that the thermal conductivity of a silicone composition could be dramatically improved by mixing a silver powder with a particular tap density and specific surface area into a particular organopolysiloxane.

That is, the present invention is to provide the following thermal conducive silicone composition, device using the same, and the method of producing the device.

[1]

A thermal conductive silicone composition comprising:
(A) an organopolysiloxane that exhibits a kinetic viscosity of 10 to 100,000 mm²/s at 25° C., and is represented by the following average composition formula (1)

$$R^1_a SiO_{(4-a)/2} \quad (1)$$

wherein $R^1$ represents a hydrogen atom or at least one group selected from a hydroxy group and a saturated or unsaturated monovalent hydrocarbon group having 1 to 18 carbon atoms, and a satisfies $1.8 \leq a \leq 2.2$; and
(B) a silver powder having a tap density of not lower than 3.0 g/cm³ and a specific surface area of not larger than 2.0 m²/g, said silver powder being in an amount of 300 to 11,000 parts by mass with respect to 100 parts by mass of the component (A).

[2]

The thermal conductive silicone composition according to [1], wherein an aspect ratio of said silver powder as the component (B) is 2.0 to 150.0.

[3]

The thermal conductive silicone composition according to [1] or [2], wherein the entire or a part of the component (A) comprises:
(C) an organopolysiloxane containing in one molecule at least two silicon-bonded alkenyl groups; and/or
(D) an organohydrogenpolysiloxane containing in one molecule at least two silicon-bonded hydrogen atoms.

[4]

The thermal conductive silicone composition according to any one of [1] to [3], further comprising a curing catalyst.

[5]

The thermal conductive silicone composition according to any one of [1] to [4], further comprising:
(E) an organosilane that is in an amount of 0 to 10 parts by mass with respect to 100 parts by mass of the component (A), and is represented by the following general formula (2)

$$R^2_b Si(OR^3)_{4-b} \quad (2)$$

wherein $R^2$ represents at least one group selected from the group consisting of: a saturated or unsaturated monovalent hydrocarbon group that may have a substituted group; an epoxy group; an acrylic group; and a methacrylic group, $R^3$ represents a monovalent hydrocarbon group, and b satisfies $1 \leq b \leq 3$.

[6]

A semiconductor device comprising:
a heat-generating electronic part; and
a heat dissipator, wherein
the thermal conductive silicone composition as set forth in any one of [1] to [5] is interposed between said heat-generating electronic part and said heat dissipator.

[7]

A manufacturing method of a semiconductor device, comprising:
a step of heating the thermal conductive silicone composition as set forth in any one of [1] to [5] to a temperature of not lower than 80° C. under a pressure of not lower than 0.01

MPa, with the thermal conductive silicone composition being interposed between a heat-generating electronic part and a heat dissipator.

The thermal conductive silicone composition of the present invention has a superior thermal conductivity, and is thus suitable for use in a semiconductor device.

BRIEF DESCRIPTION OF THE DRAWINGS

FIG. 1 is a vertical cross-sectional view of an example of a semiconductor device of the present invention.

DETAILED DESCRIPTION OF THE INVENTION

The thermal conductive silicone composition of the present invention is described in detail hereunder.
Component (A):
An organopolysiloxane as a component (A) is represented by the following average composition formula (1), and exhibits a kinetic viscosity of 10 to 100,000 mm²/s at 25° C.

$R^1_a SiO_{(4-a)/2}$ (1)

(In the above formula, $R^1$ represents a hydrogen atom or at least one group selected from a hydroxy group and a saturated or unsaturated monovalent hydrocarbon group having 1 to 18 carbon atoms; and a satisfies $1.8 \leq a \leq 2.2$.)

As represented by $R^1$ in the above formula (1), examples of the saturated or unsaturated monovalent hydrocarbon group having 1 to 18 carbon atoms include an alkyl group such as a methyl group, an ethyl group, a propyl group, a hexyl group, an octyl group, a decyl group, a dodecyl group, a tetradecyl group, a hexadecyl group and an octadecyl group; a cycloalkyl group such as a cyclopentyl group and a cyclohexyl group; an alkenyl group such as a vinyl group and an allyl group; an aryl group such as a phenyl group and a tolyl group; an aralkyl group such as a 2-phenylethyl group and a 2-methyl-2-phenylethyl group; and a halogenated hydrocarbon group such as a 3,3,3-trifluoropropyl group, a 2-(perfluorobutyl) ethyl group, a 2-(perfluorooctyl) ethyl group and a p-chlorophenyl group. It is preferred that a be within a range of 1.8 to 2.2, particularly preferably 1.9 to 2.1, in terms of a consistency required for a silicone grease composition if the silicone composition of the invention is used as a grease.

Further, when the kinetic viscosity of the organopolysiloxane of the invention at 25° C. is lower than 10 mm²/s, the silicone composition containing such organopolysiloxane will easily exhibit oil-bleed. In contrast, when such kinetic viscosity is higher than 100,000 mm²/s, the silicone composition will exhibit a high viscosity, which results in a poor handling property thereof. Therefore, it is required that such kinetic viscosity at 25° C. be 10 to 100,000 mm²/s, particularly preferably 30 to 10,000 mm²/s. The kinetic viscosity of the organopolysiloxane is a value measured by an Ostwald viscometer at 25° C.
Components (C) and (D):
It is preferred that the entire or a part of the component (A) includes a component (C) which is an organopolysiloxane containing at least two silicon-bonded alkenyl groups in one molecule; and/or a component (D) which is an organohydrogenpolysiloxane containing at least two silicon-bonded hydrogen atoms in one molecule.

The component (C) which is the organopolysiloxane containing alkenyl groups bonded to a silicon atom(s), contains in one molecule an average of not less than 2 (normally 2 to 50), preferably 2 to 20, more preferably about 2 to 10 alkenyl groups bonded to a silicon atom(s). Examples of the alkenyl groups in the organopolysiloxane as the component (C) include a vinyl group, an allyl group, a butenyl group, a pentenyl group, a hexenyl group and a heptenyl group, among which a vinyl group is particularly preferred. The alkenyl groups in the component (C) may be bonded to the silicon atoms at molecular chain terminals; and/or the silicon atoms in non-terminal sections of the molecular chain.

In the organopolysiloxane as the component (C), examples of organic groups other than alkenyl groups that can be bonded to silicon atoms include an alkyl group such as a methyl group, an ethyl group, a propyl group, a butyl group, a pentyl group, a hexyl group and a heptyl group; an aryl group such as a phenyl group, a tolyl group, a xylyl group and a naphthyl group; an aralkyl group such as a benzyl group and a phenethyl group; and a halogenated alkyl group such as a chloromethyl group, a 3-chloropropyl group and a 3,3,3-trifluoropropyl group, among which a methyl group and a phenyl group are particularly preferred.

Examples of the molecular structure of such component (C) include a linear structure, a partially-branched linear structure, an annular structure, a branched structure and a three-dimensional net-like structure. Preferably, the molecular structure of the component (C) is that of a linear diorganopolysiloxane whose main chain is basically made of repeating diorganosiloxane units (D units) and whose molecular chain terminals are both blocked by a triorganosiloxy group; or that of a mixture of such linear diorganopolysiloxane and a branched or three-dimensional net-like organopolysiloxane.

The organohydrogenpolysiloxane as the component (D) contains at least 2 (normally 2 to 300), preferably about 2 to 100 hydrogen atoms bonded to a silicon atom(s) (i.e. SiH groups) in one molecule. The organohydrogenpolysiloxane as the component (D) may be a resinous substance having any one of a linear structure, a branched structure, an annular structure and a three-dimensional net-like structure. The hydrogen atoms in the component (D) may be bonded to the silicon atom(s) at molecular chain terminals; and/or the silicon atom(s) in non-terminal sections of the molecular chain.

In the organohydrogenpolysiloxane as the component (D), examples of organic groups other than hydrogen atoms that can be bonded to silicon atoms include an alkyl group such as a methyl group, an ethyl group, a propyl group, a butyl group, a pentyl group, a hexyl group and a heptyl group; an aryl group such as a phenyl group, a tolyl group, a xylyl group and a naphthyl group; an aralkyl group such as a benzyl group and a phenethyl group; and a halogenated alkyl group such as a chloromethyl group, a 3-chloropropyl group and a 3,3,3-trifluoropropyl group, among which a methyl group and a phenyl group are particularly preferred.

Further, an organopolysiloxane (K) having a hydrolyzable group, as represented by the following general formula (3), may also be added together with the organopolysiloxane of the component (A) that is represented by the average composition formula (1). It is preferred that the additive amount of such hydrolyzable organopolysiloxane be 0 to 20% by mass, more preferably 0 to 10% by mass, with respect to the component (A).

(3)

(In formula (3), $R^4$ represents an alkyl group having 1 to 6 carbon atoms; each $R^5$ independently represents a saturated or unsaturated, substituted or unsubstituted monovalent hydrocarbon group having 1 to 18 carbon atoms; and c represents 5 to 120.)

The organopolysiloxane represented by the above formula (3) assists in highly filling the silicone composition with a powder(s). Moreover, this organopolysiloxane can also be used to hydrophobize the surface of the powder.

In the above formula (3), $R^4$ represents an alkyl group having 1 to 6 carbon atoms. Examples of such alkyl group having 1 to 6 carbon atoms include a methyl group, an ethyl group and a propyl group, among which a methyl group and an ethyl group are preferred. Each $R^5$ independently represents a saturated or unsaturated, substituted or unsubstituted monovalent hydrocarbon group having 1 to 18, preferably 1 to 10 carbon atoms. Examples of such monovalent hydrocarbon group include an alkyl group such as a methyl group, an ethyl group, a propyl group, a hexyl group, an octyl group, a decyl group, a dodecyl group, a tetradecyl group, a hexadecyl group and an octadecyl group; a cycloalkyl group such as a cyclopentyl group and a cyclohexyl group; an alkenyl group such as a vinyl group and an allyl group; an aryl group such as a phenyl group and a tolyl group; an aralkyl group such as a 2-phenylethyl group and a 2-methyl-2-phenylethyl group; and a group obtained by substituting a part of or all the hydrogen atoms in any one of the above groups with, for example, a cyano group or halogen atoms such as fluorine atoms, bromine atoms and chlorine atoms, examples of such substituted group being a 3,3,3-trifluoropropyl group, a 2-(perfluorobutyl) ethyl group, a 2-(perfluorooctyl) ethyl group and a p-chlorophenyl group. Among these groups, a methyl group is particularly preferred. In the above formula (3), c is an integer of 5 to 120, preferably an integer of 10 to 90.

Component (B):

A component (B) is a silver powder having a tap density of not lower than 3.0 g/cm$^3$ and a specific surface area of not larger than 2.0 m$^2$/g.

When the tap density of the silver powder as the component (B) is lower than 3.0 g/cm$^3$, a filling rate of the component (B) in the composition cannot be increased. As a result, the viscosity of the composition will increase, and the workability of the composition may thus be impaired under such condition. Therefore, it is favorable that this tap density be 3.0 g/cm$^3$ to 10.0 g/cm$^3$, preferably 4.5 g/cm$^3$ to 10.0 g/cm$^3$, more preferably 6.0 g/cm$^3$ to 10.0 g/cm$^3$.

When the specific surface area of the silver powder as the component (B) is larger than 2.0 m$^2$/g, the filling rate in the composition can also not be increased. As a result, the viscosity of the composition will increase, and the workability of the composition may thus be impaired under such condition. Therefore, it is favorable that this specific surface area be 0.08 m$^2$/g to 2.0 m$^2$/g, preferably 0.08 m$^2$/g to 1.0 m$^2$/g, more preferably 0.08 m$^2$/g to 0.5 m$^2$/g.

Here, the tap density described in this specification was measured as follows. That is, the silver powder was taken by an amount of 100 g, followed by quietly dropping the same into a 100 ml graduated cylinder with the aid of a funnel, and then placing such graduated cylinder on a tap density measuring device so as to drop the graduated cylinder 600 times at a drop distance of 20 mm and a rate of 60 times/min. The tap density was a value calculated based on the volume of the compacted silver powder.

Further, the specific surface area was obtained as follows. That is, the silver powder was taken by an amount of about 2 g as a sample, followed by degassing the same at 60±5° C. for 10 min, and then measuring a total surface area thereof using an automatic specific surface area measuring device (BET method). Later, the amount of the sample was measured, and the specific surface area was calculated through the following formula (4).

$$\text{Specific surface area(m}^2\text{/g)} = \text{Total surface area(m}^2\text{)} / \text{Sample amount(g)} \quad (4)$$

It is favorable that an aspect ratio of the silver powder as the component (B) be 2.0 to 150.0, preferably 3.0 to 100.0, more preferably 3.0 to 50.0. An aspect ratio refers to a ratio between the major axis and minor axis of a particle (major axis/minor axis). A method for measuring such ratio may, for example, include a step of taking an electron micrograph of particles; and a step of measuring the major and minor axes of the particles based on the electron micrograph such that the aspect ratio can then be calculated. The size of a particle can be measured based on an electron micrograph taken from the top view. Particularly, measured as a major axis is the larger diameter of the particle in the electron micrograph taken from the top view. A minor axis as opposed to such major axis is defined as the thickness of the particle. The thickness of the particle cannot be measured based on the electron micrograph taken from the top view. The thickness of the particle is measured as follows. That is, when taking an electron micrograph, a sample stage on which the particles rest is installed in a way such that the sample stage is slanted, followed by taking an electron micrograph thereof from the top view, and then calculating the thicknesses of the particles by correcting the calculation with the inclined angle of the sample stage. Specifically, after taking a number of electron micrographs at a magnification of several thousand times, the major and minor axes of 100 arbitrary particles were measured, followed by calculating the ratios between the major and minor axes (major axis/minor axis), and then obtaining an average value thereof.

There are no particular restrictions on a particle diameter of the silver powder as the component (B). Particularly, it is preferred that an average particle diameter thereof be 0.2 to 50 μm, more preferably 1.0 to 30 μm. Such average particle diameter was obtained as follows. That is, the silver powder was taken by an amount of 1 to 2 scoops with a micro spatula. The silver powder of such amount was then put into a 100 ml beaker, followed by pouring an isopropyl alcohol of about 60 ml thereinto, and then dispersing the silver powder for 1 min using an ultrasonic homogenizer. Later, a laser diffraction particle size analyzer was used to measure a mean volume diameter [MV] of the silver powder on volume basis. The measurement was carried out for a measurement period of 30 sec.

There are no restrictions on a production method of the silver powder used in the present invention. There may be employed, for example, an electrolytic method, a crushing method, a heat treatment method, an atomizing method and a reduction method.

The silver powder may be either used as it is after being produced by the above method(s); or crushed before use, without departing from the aforementioned numerical ranges. In the case of crushing the silver powder before use, there are no particular restrictions on a device for crushing the silver powder. Examples of such device include known devices such as a stamp mill, a ball mill, a vibration mill, a hammer mill, a rolling roll and a mortar. Here, a stamp mill, a ball mill, a vibration mill and a hammer mill are preferred.

The component (B) is added in an amount of 300 to 11,000 parts by mass with respect to 100 parts by mass of the component (A). If the component (B) is in an amount of smaller than 300 parts by mass with respect to 100 parts by mass of the component (A), the thermal conductivity of the composition obtained will be impaired. Further, if the component (B) is in an amount of larger than 11,000 parts by mass with respect to 100 parts by mass of the component (A), the fluidity of the composition will be impaired, which will lead to a poor handling property. It is preferred that the component (B) be in an amount of 300 to 5,000 parts by mass, more preferably 500 to 5,000 parts by mass, with respect to 100 parts by mass of the component (A).

In addition to the component (B), the thermal conductive silicone composition of the present invention may also contain an inorganic compound powder and/or an organic compound material without impairing the effects of the invention. As such inorganic compound powder, those with a high thermal conductivity are preferred. For example, there may be used at least one inorganic compound powder selected from a group of an aluminum powder, a zinc oxide powder, a titanium oxide powder, a magnesium oxide powder, an alumina powder, an aluminum hydroxide powder, a boron nitride powder, an aluminum nitride powder, a diamond powder, a gold powder, a copper powder, a carbon powder, a nickel powder, an indium powder, a gallium powder, a metal silicon powder and a silicon dioxide powder. As the organic compound material, those with a high thermal conductivity are also preferred. For example, there may be used at least one organic compound material selected from a group of a carbon fiber, a graphene, a graphite, a carbon nanotube and a carbon material. If necessary, the surfaces of these inorganic compound powders and organic compound materials may be hydrophobized by, for example, organosilane, organosilazane, organopolysiloxane or an organic fluorine compound. The filling rate in a composition obtained will not increase, when an average particle diameter of the inorganic compound powders and the organic compound materials is either smaller than 0.5 µm or larger than 100 µm. Therefore, a range of 0.5 to 100 µm is preferred, and a range of 1 to 50 µm is particularly preferred. Further, the filling rate therein will not increase, when the fiber length of the carbon fiber is either smaller than 10 µm or larger than 500 µm. Therefore, a range of 10 to 500 µm is preferred, and a range of 30 to 300 µm is particularly preferred. When the inorganic compound powder(s) and the organic compound material(s) are added in an amount of larger than 3,000 parts by mass with respect to 100 parts by mass of the component (A), a poor fluidity will be resulted, which will then lead to a poor handling property. Therefore, it is preferred that the inorganic compound powder(s) and the organic compound material(s) are added in an amount of 0 to 3,000 parts by mass, particularly preferably 0 to 2,000 parts by mass with respect to 100 parts by mass of the component (A).

Curing Catalyst:

Further, the composition of the present invention can be turned into a curable composition by adding a curing catalyst thereto. If the composition of the invention is cured through a hydrosilylation reaction, there are added the components (C) and (D) as the component (A); and a platinum-based catalyst. It is preferred that the component (D) be added in an amount at which the silicon atom-bonded hydrogen atoms in the component (D) will be in an amount of 0.1 to 10 mol, more preferably 0.1 to 5 mol, particularly preferably 0.1 to 3.0 mol, with respect to 1 mol of the alkenyl groups in the component (C).

A platinum-based catalyst is a catalyst for promoting the curing of the composition of the present invention. Examples of such platinum-based catalyst include a chloroplatinic acid, an alcohol solution of a chloroplatinic acid, an olefin complex of platinum, an alkenylsiloxane complex of platinum and a carbonyl complex of platinum.

In the composition of the present invention, the platinum-based catalyst is contained in an amount required to cure the composition i.e. a so-called catalytic amount. Specifically, it is preferred that the platinum-based catalyst be contained in an amount at which the platinum metal in this component will be in an amount of 0 to 500 ppm by mass, particularly preferably 0 to 200 ppm by mass, with respect to the component (A).

Further, in order to control the curing rate of the composition of the invention and improve the handling property thereof, there may also be contained a curing reaction inhibiting agent such as an acetylene-based compound (e.g. 2-methyl-3-butyn-2-ol, 2-phenyl-3-butyn-2-ol and 1-ethynyl-1-cyclohexanol); an enyne compound (e.g. 3-methyl-3-pentene-1-yne and 3,5-dimethyl-3-hexene-1-yne); a hydrazine-based compound; a phosphine-based compound; and a mercaptan-based compound. There are no restrictions on the amount of the curing reaction inhibiting agent contained. Particularly, it is preferred that this curing reaction inhibiting agent be contained in an amount of 0.0001 to 1.0 parts by mass with respect to 100 parts by mass of the component (A).

Moreover, if the composition of the invention is cured through a condensation reaction, it is preferred that the composition contain as a curing agent a silane or siloxane oligomer having at least three silicon atom-bonded hydrolyzable groups in one molecule; and contain as a curing catalyst a catalyst for condensation reaction. Here, examples of such silicon atom-bonded hydrolyzable groups include an alkoxy group, an alkoxyalkoxy group, an acyloxy group, a ketoxime group, an alkenoxy group, an amino group, an aminoxy group and an amide group. In addition, other than the above hydrolyzable groups, the silicon atoms in such silane may also be bonded to, for example, a linear alkyl group similar to that described above, a branched alkyl group, an annular alkyl group, an alkenyl group, an aryl group, an aralkyl group and/or a halogenated alkyl group. Examples of such silane or siloxane oligomer include tetraethoxysilane, methyltriethoxysilane, vinyltriethoxysilane, methyltris(methylethyl ketoxime) silane, vinyltriacetoxysilane, ethyl orthosilicate and vinyltri(isopropenoxy) silane.

Such silane or siloxane oligomer is contained in an amount required to cure the composition of the invention. Specifically, it is preferred that the silane or siloxane oligomer be contained in an amount of 0.01 to 20 parts by mass, particularly preferably 0.1 to 10 parts by mass, with respect to 100 parts by mass of the component (A).

Further, the abovementioned catalyst for condensation reaction is an optional component, and is thus not essential when using as a curing agent a silane having a hydrolyzable group(s) such as an aminoxy group, an amino group and a ketoxime group. Examples of such catalyst for condensation reaction include an organic titanic acid ester such as tetrabutyl titanate and tetraisopropyl titanate; an organic titanium chelate compound such as diisopropoxy bis(acetylacetate) titanium and diisopropoxy bis(ethylacetoacetate) titanium; an organic aluminum compound such as aluminum tris (acetylacetonate) and aluminum tris(ethylacetoacetate); an organic zirconium compound such as zirconium tetra(acetylacetonate) and zirconium tetra butyrate; an organic tin compound such as dibutyltin dioctoate, dibutyltin dilaurate and butyltin-2-ethylhexoate; a metallic salt of an organic carboxylic acid such as tin naphthenate, tin oleate, tin butyrate, cobalt naphthenate and zinc stearate; an amine compound such as hexylamine and dodecylamine phosphate, and salts of these amine compounds; a quaternary ammonium salt such as benzyl triethyl ammonium acetate; a short-chain fatty acid salt of an alkali metal such as potassium acetate; a dialkylhydroxylamine such as dimethylhydroxylamine and diethylhydroxylamine; and a guanidyl group-containing organic silicon compound.

In the composition of the present invention, the catalyst for condensation reaction is contained in an arbitrary amount. If added, it is preferred that such catalyst for condensation reaction be contained in an amount of 0.01 to 20 parts by mass, particularly preferably 0.1 to 10 parts by mass, with respect to 100 parts by mass of the component (A).

Further, if the composition of the invention is cured through a free radical reaction by an organic peroxide(s), it is preferred that an organic peroxide be used as a curing catalyst. Examples of such organic peroxide include benzoyl peroxide, di(p-methylbenzoyl) peroxide, di(o-methylbenzoyl) peroxide, dicumyl peroxide, 2,5-dimethyl-2,5-bis(t-butylperoxy) hexane, di-t-butyl peroxide, t-butyl peroxybenzoate and 1,1-di(t-butylperoxy) cyclohexane. Such organic peroxide is contained in an amount required to cure the composition of the invention. Specifically, it is preferred that this organic peroxide be contained in an amount of 0.1 to 5 parts by mass with respect to 100 parts by mass of the component (A).

Component (E):

In addition, an organosilane represented by the following general formula (2) may be added to the composition of the invention as a component (E).

$$R^2{}_b Si(OR^3)_{4-b} \quad (2)$$

(In the above formula, $R^2$ represents at least one group selected from the group consisting of: a saturated or unsaturated monovalent hydrocarbon group that may have a substituted group; an epoxy group; an acrylic group; and a methacrylic group. $R^3$ represents a monovalent hydrocarbon group, and b satisfies $1 \leq b \leq 3$.)

Examples of $R^2$ in the above general formula (2) include an alkyl group such as a methyl group, an ethyl group, a propyl group, a hexyl group, an octyl group, a nonyl group, a decyl group, a dodecyl group and a tetradecyl group; a cycloalkylalkenyl group; an acrylic group; an epoxy group; a cycloalkyl group such as a cyclopentyl group and a cyclohexyl group; an alkenyl group such as a vinyl group and an allyl group; an aryl group such as a phenyl group and a tolyl group; an aralkyl group such as a 2-phenylethyl group and a 2-methyl-2-phenylethyl group; and a halogenated hydrocarbon group such as a 3.3.3-trifluoropropyl group, a 2-(perfluorobutyl) ethyl group, a 2-(perfluorooctyl) ethyl group, and a p-chlorophenyl group. Examples of the substituted group in the monovalent hydrocarbon group include an acryloyloxy group and a methacryloyloxy group. Further, b represents 1 to 3. $R^3$ represents at least one alkyl group having 1 to 6 carbon atoms, such as a methyl group, an ethyl group, a propyl group, a butyl group, a pentyl group and a hexyl group, among which a methyl group and an ethyl group are particularly preferred.

Following are specific examples of the organosilane as the component (E) and represented by the general formula (2).

$C_{10}H_{21}Si(OCH_3)_3$
$C_{12}H_{25}Si(OCH_3)_3$
$C_{12}H_{25}Si(OC_2H_5)_3$
$C_{10}H_{21}Si(CH_3)(OCH_3)_2$
$C_{10}H_{21}Si(C_6H_6)(OCH_3)_2$
$C_{10}H_{21}Si(CH_3)(OC_2H_5)_2$
$C_{10}H_{21}Si(CH=CH_2)(OCH_3)_2$
$C_{10}H_{21}Si(CH_2CH_2CF_3)(OCH_3)_2$
$CH_2=C(CH_3)COOC_8H_{16}Si(OCH_3)_3$

If such organosilane is added, it is preferred that the organosilane be added in an amount of 0.1 to 20 parts by mass, more preferably 0.1 to 10 parts by mass, with respect to 100 parts by mass of the component (A).

There are no restrictions on a production method of the silicone composition of the present invention. In fact, the silicone composition of the invention may be produced in accordance with a known method for producing a silicone composition. For example, the silicone composition may be produced by mixing the components (A) and (B) and, if necessary, other components as well for 30 min to 4 hours, using, for example, a mixer by INOUE MFG., INC., such as TRI-MIX®, Twin Mix® and Planetary Mixer®; a mixer by MIZUHO INDUSTRIAL CO., LTD., such as Ultramixer®; and a mixer by PRIMIX Corporation, such as HIVIS DISPER MIX®. If necessary, these components may also be heated at a temperature of 50 to 150° C. while being mixed together.

It is preferred that the thermal conductive silicone composition of the present invention, when measured at 25° C., exhibit an absolute viscosity of 10 to 600 Pa·s, more preferably 50 to 500 Pa·s, or even more preferably 50 to 400 Pa·s. When the absolute viscosity is within the above ranges, there can be obtained a favorable grease and achieved a superior workability. Such absolute viscosity can be achieved by adjusting the added amount of each component in accordance with the added amounts described earlier. The absolute viscosity is a result measured by PC-1TL (10 rpm) (by Malcom Co., Ltd.).

The thermal conductive silicone composition thus obtained is then heated to a temperature of not lower than 80° C. with a pressure of 0.01 MPa being applied thereto, thereby curing the thermal conductive silicone composition of the invention. There are no restrictions on the forms of a cured product thus obtained. This cured product may be in the form of a gel, a rubber with a low hardness or a rubber with a high hardness.

Semiconductor Device:

The semiconductor device of the present invention has the thermal conductive silicone composition of the invention interposed between the surface of a heat-generating electronic part and a heat dissipator. It is preferred that the thermal conductive silicone composition of the invention interposed have a thickness of 10 to 200 μm.

FIG. 1 shows a typical structure of the semiconductor device of the invention. However, the semiconductor device of the present invention is not limited to that having such a kind of structure. A numerical symbol "3" in FIG. 1 represents the thermal conductive silicone of the invention. Further, in FIG. 1, a numerical symbol "1" represents a substrate; a numerical symbol "2" represents a heat-generating electronic part (CPU); and a numerical symbol "4" represents a heat dissipator (lid).

It is preferred that the semiconductor device of the present invention be manufactured in a way such that the thermal conductive silicone composition of the invention interposed between the heat-generating electronic part and the heat dissipator is heated to a temperature of not lower than 80° C. under a pressure of not smaller than 0.01 MPa. At that time, it is preferred that the pressure applied be not smaller than 0.01 MPa, more preferably 0.05 to 100 MPa, and particularly preferably 0.1 to 100 MPa. The temperature for heating has to be 80° C. or higher. It is preferred that such temperature be 90 to 300° C., more preferably 100 to 300° C., or even more preferably 120 to 300° C.

WORKING EXAMPLE

The present invention is described in greater detail hereunder with reference to working and comparative examples, for the purpose of further clarifying the effects of the invention. However, the present invention is not limited to the following examples.

Tests regarding the effects of the invention were performed as follows.

Viscosity

The absolute viscosity of the composition was measured by a Malcom viscometer (Type PC-1TL) at 25° C.

Thermal Conductivity

Each of the compositions prepared in working examples 1 to 13; and comparative examples 1 to 8 was poured into a mold of a thickness of 6 mm, and then heated to 170° C. under a pressure of 0.1 MPa. The thermal conductivity of such composition was later measured by TPS-2500 S (by KYOTO ELECTRONICS MANUFACTURING CO., LTD.) at 25° C. As for the compositions prepared in working examples 14 and 15, each of them was poured into a mold of a thickness of 6 mm, and then left for seven days at 23±2° C./50±5% RH, followed by measuring the thermal conductivity thereof at 25° C. through TPS-2500 S (by KYOTO ELECTRONICS MANUFACTURING CO., LTD.).

There were prepared the following components for use in the composition.

Component (A)

A-1: Dimethylpolysiloxane with both terminal ends blocked by dimethylvinylsilyl groups, and exhibiting a kinetic viscosity of 600 mm²/s at 25° C.

A-2: Organopolysiloxane composed of a $((CH_3)_3SiO_{1/2})$ unit and a $((CH_3)_2SiO)$ unit, and exhibiting a kinetic viscosity of 5,000 mm²/s at 25° C.

A-3: Organohydrogenpolysiloxane represented by the following formula

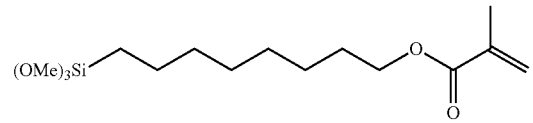

A-4: Dimethylpolysiloxane with both terminal ends blocked by hydroxyl groups, and exhibiting a kinetic viscosity of 5,000 mm²/s at 25° C.

A-5 (Comparative example): Organopolysiloxane composed of a $((CH_3)_3SiO_{1/2})$ unit and a $((CH_3)_2SiO)$ unit, and exhibiting a kinetic viscosity of 200,000 mm²/s Component (B)

B-1: Silver powder with a tap density of 6.2 g/cm³; a specific surface area of 0.48 m²/g; and an aspect ratio of 13

B-2: Silver powder with a tap density of 6.4 g/cm³; a specific surface area of 0.28 m²/g; and an aspect ratio of 8

B-3: Silver powder with a tap density of 9.0 g/cm³; a specific surface area of 0.16 m²/g; and an aspect ratio of 30

B-4: Silver powder with a tap density of 3.0 g/cm³; a specific surface area of 2.0 m²/g; and an aspect ratio of 50

B-5 (Comparative example): Silver powder with a tap density of 2.3 g/cm³; a specific surface area of 2.3 m²/g; and an aspect ratio of 1

B-6 (Comparative example): Silver powder with a tap density of 3.3 g/cm³; a specific surface area of 2.11 m²/g; and an aspect ratio of 1

B-7 (Comparative example): Silver powder with a tap density of 2.8 g/cm³; a specific surface area of 1.8 m²/g; and an aspect ratio of 2

Component (K)

K-1: Organopolysiloxane represented by the following formula

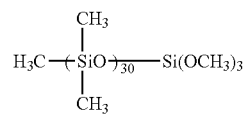

Component (E)

E-1: Organosilane represented by the following formula

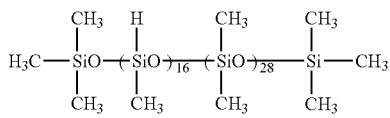

Component (F) Curing Catalyst

F-1: A-1 solution of platinum-divinyltetramethyldisiloxane complex, containing 1 wt % of platinum atoms Component (G) Curing Reaction Inhibiting Agent G-1: 1-ethynyl-1-cyclohexanol Component (H) Curing Catalyst H-1: Peroxide (PERHEXA®C by NOF CORPORATION.)

Component (I) Curing Agent

I-1: vinyltri(isopropenoxy) silane

Component (J) Catalyst for Condensation Reaction

J-1: Tetramethylguanidylpropyltrimethoxysilane

Working Examples 1 to 15; and Comparative Examples 1 to 8

The compositions in working examples 1 to 15 and comparative examples 1 to 8 were obtained by combining and mixing the components shown in Tables 1 to 3 through the following manner.

That is, the components (A), (K) and (E) were put into a 5 L planetary mixer (by INOUE MFG., INC.), followed by adding the component (B) thereto, and then performing mixing at 25° C. for 1.5 hours. Next, the component (F), (G), (H), (I) or (J) was further added thereto, followed by further performing mixing in a homogenous manner.

TABLE 1

| Unit: part by mass | | | | | | | | |
|---|---|---|---|---|---|---|---|---|
| | Working example | | | | | | | |
| | 1 | 2 | 3 | 4 | 5 | 6 | 7 | 8 |
| A-1 | 98 | | 98 | 100 | 100 | 98 | 98 | 98 |
| A-2 | | 100 | | | | | | |
| A-3 | 2 | | 2 | | | 2 | 2 | 2 |
| A-4 | | | | | | | | |
| A-5 | | | | | | | | |
| B-1 | 600 | 600 | 4800 | 600 | 600 | | | |
| B-2 | | | | | | 600 | 1900 | 4800 |

TABLE 1-continued

Unit: part by mass

| | Working example | | | | | | | |
|---|---|---|---|---|---|---|---|---|
| | 1 | 2 | 3 | 4 | 5 | 6 | 7 | 8 |
| B-3 | | | | | | | | |
| B-4 | | | | | | | | |
| B-5 | | | | | | | | |
| B-6 | | | | | | | | |
| B-7 | | | | | | | | |
| K-1 | 9 | 10 | 9 | | | 9 | 9 | 9 |
| E-1 | | | | | 10 | | | |
| F-1 | 1.77 | | 1.77 | | | 1.77 | 1.77 | 1.77 |
| G-1 | 0.17 | | 0.17 | | | 0.17 | 0.17 | 0.17 |
| H-1 | | | | | | | | |
| I-1 | | | | | | | | |
| J-1 | | | | | | | | |
| Viscosity (Pa·s) | 175 | 311 | 388 | 215 | 148 | 121 | 195 | 362 |
| Thermal conductivity (W/mK) | 17 | 17 | 72 | 20 | 15 | 20 | 64 | 85 |

TABLE 2

Unit: part by mass

| | Working example | | | | | | |
|---|---|---|---|---|---|---|---|
| | 9 | 10 | 11 | 12 | 13 | 14 | 15 |
| A-1 | 98 | 98 | 98 | 98 | 100 | 98 | |
| A-2 | | | | | | | |
| A-3 | 2 | 2 | 2 | 2 | | 2 | |
| A-4 | | | | | | | 100 |
| A-5 | | | | | | | |
| B-1 | | 600 | | | | | |
| B-2 | 1900 | | | | 1900 | | 1900 |
| B-3 | | | 600 | | | 11000 | |
| B-4 | | | | 600 | | | |
| B-5 | | | | | | | |
| B-6 | | | | | | | |
| B-7 | | | | | | | |
| K-1 | | 9 | 9 | 9 | | 9 | |
| E-1 | 9.8 | | | | | | |
| F-1 | | 1.77 | 1.77 | 1.77 | | 1,77 | |
| G-1 | | 0.17 | 0.17 | 0.17 | | 0.17 | |
| H-1 | | | | | 4.0 | | |
| I-1 | | | | | | | 7.0 |
| J-1 | | | | | | | 1 |
| Viscosity (Pa·s) | 198 | 175 | 161 | 423 | 190 | 574 | 392 |
| Thermal conductivity (W/mK) | 68 | 17 | 18 | 15 | 60 | 92 | 50 |

TABLE 3

Unit: part by mass

| | Comparative example | | | | | | | |
|---|---|---|---|---|---|---|---|---|
| | 1 | 2 | 3 | 4 | 5 | 6 | 7 | 8 |
| A-1 | | 98 | 98 | 98 | 98 | 98 | 98 | 98 |
| A-2 | | | | | | | | |
| A-3 | | 2 | 2 | 2 | 2 | 2 | 2 | 2 |
| A-4 | | | | | | | | |
| A-5 | 100 | | | | | | | |
| B-1 | 600 | 280 | 12000 | | | | | |
| B-2 | | | | 280 | | | | |
| B-3 | | | | | 12000 | | | |
| B-4 | | | | | | | | |
| B-5 | | | | | | 350 | | |
| B-6 | | | | | | | 350 | |
| B-7 | | | | | | | | 350 |
| K-1 | | 9 | 9 | 9 | 9 | 9 | 9 | 9 |
| E-1 | | | | | | | | |
| F-1 | | 1.77 | 1.77 | 1.77 | 1.77 | 1.77 | 1.77 | 1.77 |
| G-1 | | 0.17 | 0.17 | 0.17 | 0.17 | 0.17 | 0.17 | 0.17 |
| H-1 | | | | | | | | |
| I-1 | | | | | | | | |
| Viscosity (Pa·s) | 810 | Unmeasurable due to extremely low viscosity | Unable to form grease | Unmeasurable due to extremely low viscosity | Unable to form grease | 648 | 612 | 623 |
| Thermal conductivity (W/mK) | 17 | 2 | | 3 | | 5 | 6 | 5 |

What is claimed:

1. A semiconductor device comprising: a heat-generating electronic part; and a heat dissipator,
wherein a thermal conductive silicone composition comprising
(A) an organopolysiloxane that exhibits a kinetic viscosity of 10 to 100,000 mm$^2$/s at 25° C., and is represented by the following average composition formula (1)

$$R^1_a SiO_{(4-a)/2} \quad (1)$$

wherein $R^1$ represents a hydrogen atom or at least one group selected from a hydroxy group and a saturated or unsaturated monovalent hydrocarbon group having 1 to 18 carbon atoms, and a satisfies 1.8≤a≤2.2; and
(B) a silver powder having a tap density of not lower than 3.0 g/cm$^3$ and a specific surface area of not larger than 2.0 m$^2$/g, said silver powder being in an amount of 300 to 11,000 parts by mass with respect to 100 parts by mass of the component (A)
is interposed between said heat-generating electronic part and said heat dissipator.

2. A manufacturing method of a semiconductor device, comprising:
a step of heating a thermal conductive silicone composition to a temperature of not lower than 80° C. under a pressure of not lower than 0.01 MPa, with the thermal conductive silicone composition being interposed between a heat-generating electronic part and a heat dissipator, wherein the thermal conductive silicone composition comprises:
(A) an organopolysiloxane that exhibits a kinetic viscosity of 10 to 100,000 mm$^2$/s at 25° C., and is represented by the following average composition formula (1)

$$R^1_a SiO_{(4-a)/2} \quad (1)$$

wherein $R^1$ represents a hydrogen atom or at least one group selected from a hydroxy group and a saturated or unsaturated monovalent hydrocarbon group having 1 to 18 carbon atoms, and a satisfies 1.8≤a≤2.2; and
(B) a silver powder having a tap density of not lower than 3.0 g/cm$^3$ and a specific surface area of not larger than 2.0 m$^2$/g, said silver powder being in an amount of 300 to 11,000 parts by mass with respect to 100 parts by mass of the component (A).

3. The semiconductor device according to claim 1, wherein an aspect ratio of said silver powder as the component (B) is 2.0 to 150.0.

4. The semiconductor device according to claim 1, wherein the entire or a part of the component (A) comprises:
(C) an organopolysiloxane containing in one molecule at least two silicon-bonded alkenyl groups; and/or
(D) an organohydrogenpolysiloxane containing in one molecule at least two silicon-bonded hydrogen atoms.

5. The semiconductor device according to claim 3, wherein the entire or a part of the component (A) comprises:
(C) an organopolysiloxane containing in one molecule at least two silicon-bonded alkenyl groups; and/or
(D) an organohydrogenpolysiloxane containing in one molecule at least two silicon-bonded hydrogen atoms.

6. The semiconductor device according to claim 1, wherein the thermal conductive silicone composition further comprises a curing catalyst.

7. The semiconductor device according to claim 3, wherein the thermal conductive silicone composition further comprises a curing catalyst.

8. The semiconductor device according to claim 4, wherein the thermal conductive silicone composition further comprises a curing catalyst.

9. The semiconductor device according to claim 5, wherein the thermal conductive silicone composition further comprises a curing catalyst.

10. The semiconductor device according to claim 1, wherein the thermal conductive silicone composition further comprises:
(E) an organosilane that is in an amount of 0 to 10 parts by mass with respect to 100 parts by mass of the component (A), and is represented by the following general formula (2)

$$R^2_b Si(OR^3)_{4-b} \quad (2)$$

wherein $R^2$ represents at least one group selected from the group consisting of: a saturated or unsaturated monovalent hydrocarbon group that may have a substituted group; an epoxy group; an acrylic group; and a methacrylic group, $R^3$ represents a monovalent hydrocarbon group, and b satisfies 1≤b≤3.

11. The semiconductor device according to claim 3, wherein the thermal conductive silicone composition further comprises:
(E) an organosilane that is in an amount of 0 to 10 parts by mass with respect to 100 parts by mass of the component (A), and is represented by the following general formula (2)

$$R^2_b Si(OR^3)_{4-b} \quad (2)$$

wherein $R^2$ represents at least one group selected from the group consisting of: a saturated or unsaturated monovalent hydrocarbon group that may have a substituted group; an epoxy group; an acrylic group; and a methacrylic group, $R^3$ represents a monovalent hydrocarbon group, and b satisfies 1≤b≤3.

12. The semiconductor device according to claim 4, wherein the thermal conductive silicone composition further comprises:
(E) an organosilane that is in an amount of 0 to 10 parts by mass with respect to 100 parts by mass of the component (A), and is represented by the following general formula (2)

$$R^2_b Si(OR^3)_{4-b} \quad (2)$$

wherein $R^2$ represents at least one group selected from the group consisting of: a saturated or unsaturated monovalent hydrocarbon group that may have a substituted group; an epoxy group; an acrylic group; and a methacrylic group, $R^3$ represents a monovalent hydrocarbon group, and b satisfies 1≤b≤3.

13. The semiconductor device according to claim 5, wherein the thermal conductive silicone composition comprises:
(E) an organosilane that is in an amount of 0 to 10 parts by mass with respect to 100 parts by mass of the component (A), and is represented by the following general formula (2)

$$R^2_b Si(OR^3)_{4-b} \quad (2)$$

wherein $R^2$ represents at least one group selected from the group consisting of: a saturated or unsaturated monovalent hydrocarbon group that may have a substituted group; an epoxy group; an acrylic group; and a methacrylic group, $R^3$ represents a monovalent hydrocarbon group, and b satisfies 1≤b≤3.

* * * * *